United States Patent
Baranski et al.

[11] Patent Number: 5,959,448
[45] Date of Patent: Sep. 28, 1999

[54] OPTICALLY ISOLATED LINE VOLTAGE SENSING CIRCUIT

[75] Inventors: Zbigniew Baranski, Lake Hiawatha; John Hayes, Blairstown, both of N.J.

[73] Assignee: Automatic Switch Company, Florham Park, N.J.

[21] Appl. No.: 08/711,705

[22] Filed: Sep. 6, 1996

[51] Int. Cl.[6] .......................... G01R 19/00; G01R 19/14; G01R 19/22
[52] U.S. Cl. .............................. 324/96; 324/119; 324/133
[58] Field of Search .............................. 324/96, 106, 119, 324/133

[56] References Cited

U.S. PATENT DOCUMENTS

| | | | |
|---|---|---|---|
| 2,038,277 | 4/1936 | Gent | 324/96 |
| 2,081,839 | 5/1937 | Rankin | 324/96 |
| 3,312,895 | 4/1967 | Garbuny | 324/96 |
| 3,829,774 | 8/1974 | Cerveny | 324/119 |
| 4,527,118 | 7/1985 | Koslar | 324/133 |
| 4,788,493 | 11/1988 | Liptak | 324/133 |

*Primary Examiner*—Ernest F. Karlsen
*Attorney, Agent, or Firm*—Levine & Mandelbaum

[57] ABSTRACT

A linear optocoupler is employed to provide a signal which is a galvanically isolated reproduction of the magnitude of an A.C. line voltage and another galvanically isolated signal indicative of a change in the polarity of the line voltage for enabling safe monitoring of a change the A.C. voltage. Actuation of an automatic transfer switch to substitute an emergency source of power for a normal source that has failed may be achieved with the emergency power waveform used to replicate the normal power waveform.

8 Claims, 3 Drawing Sheets

OPTICALLY ISOLATED LINE VOLTAGE SENSING CIRCUIT

BACKGROUND OF THE INVENTION

This invention relates to electronic control circuits for automatic transfer switches. More specifically, the invention is directed to apparatus for protecting the user of electronic control circuits for automatic transfer switches from the potentially dangerous A.C. line voltage by galvanic isolation of the line voltage from the required measurement circuit.

Electronic control circuits for automatic transfer switches measure normal and emergency line voltages in order to ensure that emergency power is promptly applied upon failure of the normal source of line voltage and that the emergency voltage is a reasonable facsimile of the normal voltage. In order to protect the user of the control circuitry from the potentially dangerous line voltages, galvanic isolation between the line voltage and the measurement circuit must be maintained. The amplitudes of the line voltages being monitored must be scaled to smaller magnitudes which can be accommodated by semiconductor measuring circuits. In the past, transformers have been used to isolate the measurement circuit from the line voltages, and to scale the voltages to workable levels. Such prior art solutions have been problematic in that transformers are relatively large and heavy and must be manually mounted in their operating environments.

SUMMARY OF THE INVENTION

The aforementioned problems of the prior art are overcome by the instant invention which provides for a circuit that attenuates and rectifies the line voltage signal. A linear optocoupler is employed to provide a galvanically isolated reproduction of the magnitude of the rectified output voltage. A galvanically isolated signal indicative of the polarity of the line voltage waveform is additionally provided. An isolated power supply provides isolated power for the circuitry that operates on the line side of the circuit.

Hence the invention utilizes apparatus for indicating the magnitude and polarity of the voltage of an A.C. voltage source in real time, including absolute value means having an input electrically connectable to the source for producing a signal having an amplitude proportional to the absolute value of the voltage. A first light emitting means has an input electrically connected to the absolute value means and an output at which there is produced light having an intensity proportional to the absolute value of the source voltage. A first light sensing means is responsive to the light emitted at the output of the first light emitting means for producing an electrical signal having a magnitude proportional to the absolute value of the source voltage. The first light sensing means is electrically isolated from the voltage source. A feedback light sensing means is electrically connected to the input of the absolute value means and optically coupled to the output of the first light emitting means for causing the intensity of the light emitted by the first light emitting means to be proportional to the absolute value of the magnitude of the source A.C. voltage. A diode means is electrically connected to the output of the absolute value means for causing a discontinuity in the magnitude of the voltage at the output of the absolute value means in response to a change in polarity of the A.C. line voltage. Detector means is electrically connected to the output of the absolute value means for detecting the discontinuity. Second light emitting means has an input electrically connected to the detector means and an optical output at which there is generated light having an intensity responsive to the polarity of the A.C. voltage. A second light sensing means is responsive to the light emitted at the output of the second light emitting means for producing an electrical signal indicating a change in the polarity of the A.C. voltage. The second light sensing means is also electrically isolated from the A.C. voltage source.

It is therefore an object of the invention to provide apparatus which is electrically isolated from a source of A.C. voltage for safely monitoring the amplitude of the voltage in real time.

Another object of the invention is to provide apparatus which is electrically isolated from a source of A.C. voltage for safely monitoring the polarity of the voltage in real time.

Still another object of the invention is to provide apparatus which is electrically isolated from a source of A.C. voltage for safely monitoring changes in polarity of voltage in real time without the use of a transformer.

A further object of the invention is to provide apparatus which is electrically isolated from a source of A.C. voltage for safely monitoring the source voltage in real time, which apparatus can be surface mounted on a circuit board.

Other and further objects of the invention will be apparent from the following drawings and description of a preferred embodiment of the invention in which like reference numerals are used to indicate like parts in the various views.

DESCRIPTION OF THE PREFERRED EMBODIMENT

Figure 1:
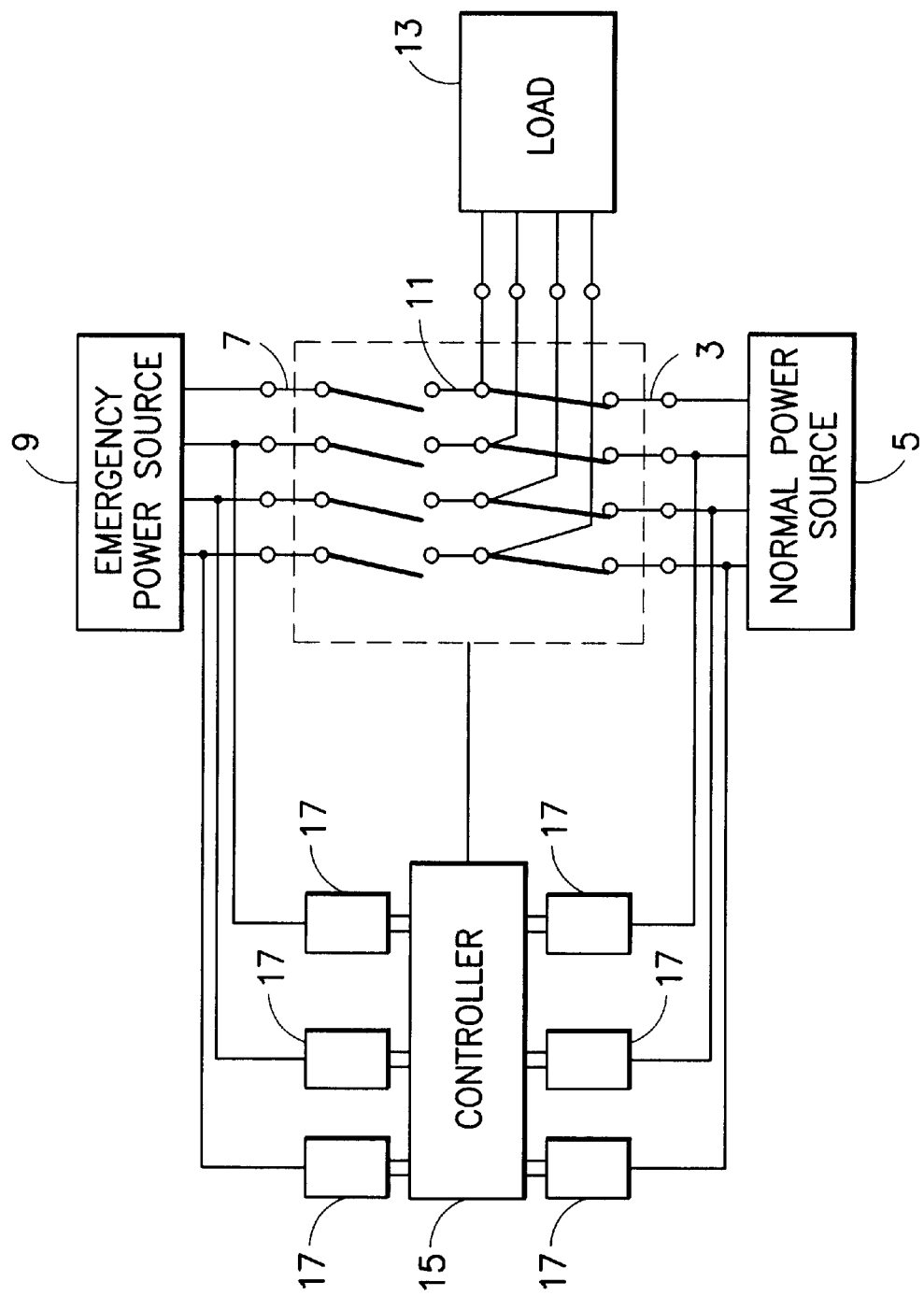
FIG. 1 is a schematic view illustrating the environment of the invention.

Referring now to FIG. 1 of the drawings there is shown a transfer switch 1 having respective normal power input terminals 3 connected to a normal source of power 5, e.g., a three phase voltage line from a utility electrical power supplier, and emergency power input terminals 7 connected to an emergency source of power 9, e.g., a local generator. The transfer switch 1 has output terminals 11 permanently connected to a load 13 which is intended to be powered by the normal power source 5 except during failure of the normal source 5 at which time it is desired to disconnect the normal power source 5 and substitute power supplied by the emergency source 9.

A controller 15 having a microprocessor and digital storage capability monitors the line voltage at each phase of the normal power source 5 while the normal source 5 is active, and actuates the transfer switch 1 to substitute emergency power upon detection of a sustained interruption of normal power. In order to match the phase and amplitude of the disconnected normal power and substituted emergency power, the line voltages of each of the phases of the normal and emergency power sources are monitored by voltage sensing circuits 17 to determine the magnitudes and polarities of the normal and emergency source voltages.

Figure 2:
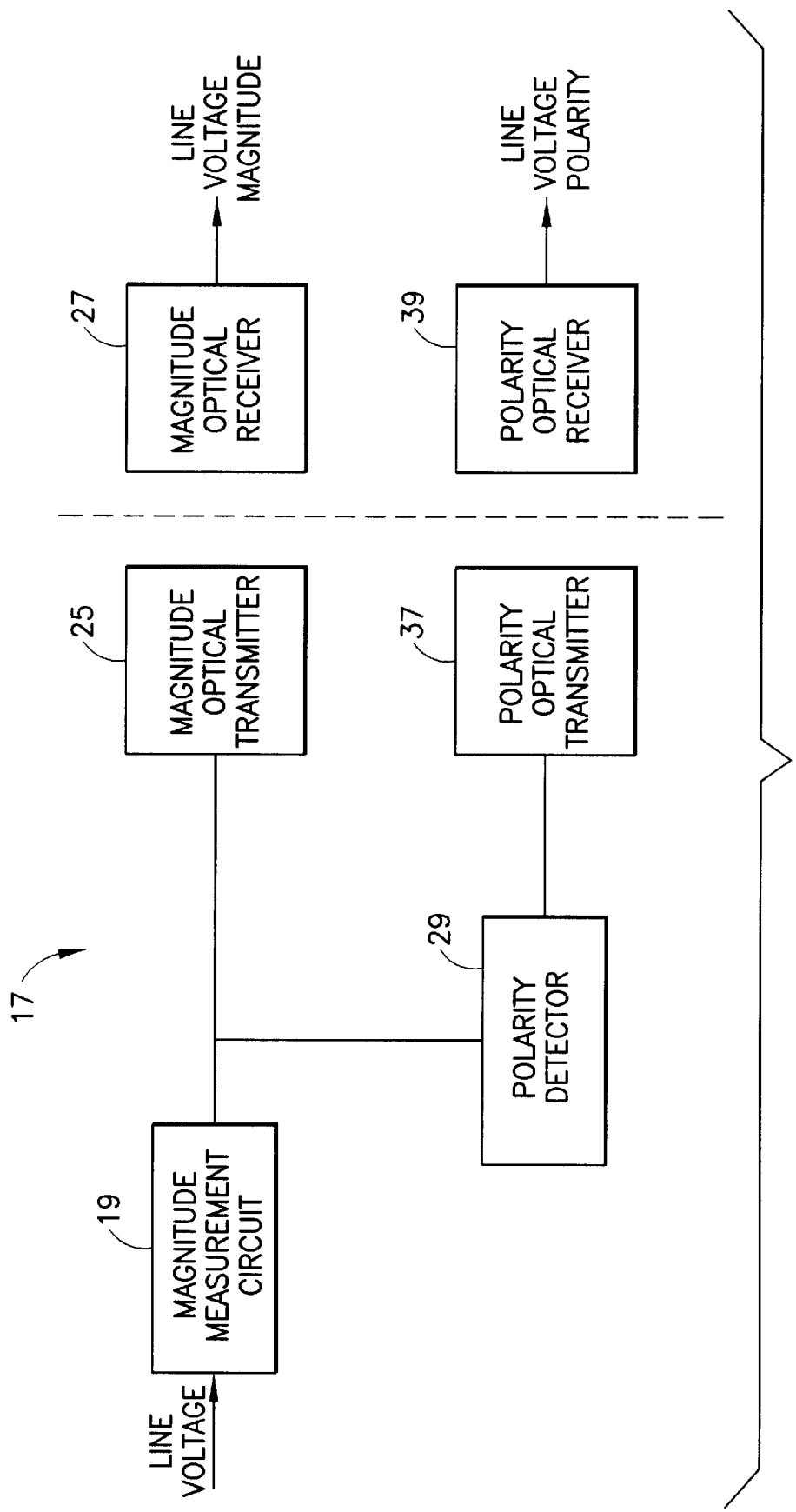
FIG. 2 is a block diagrammatical view of an isolated line voltage sensing circuit in accordance with the preferred embodiment of the invention which is intended for use in the environment of FIG. 1.

Referring now to FIG. 2 of the drawings, there is shown a voltage sensing circuit 17 which is transformerless, i.e., all of the components of the circuit can be surface mounted on a printed circuit board. The voltage sensing circuit has a magnitude measurement circuit 19 with an input terminal connected to a respective phase of the normal or emergency power source and an output terminal at which there is produced an output signal having an amplitude proportional to the amplitude of the line voltage at the input terminal.

The output signal from the magnitude measurement circuit 19 is, in turn, applied to an input terminal of a magnitude optical transmitter 25 for illuminating a light emitting device with an intensity proportional to the amplitude of the output signal from the magnitude measurement circuit 19. A magnitude optical receiver 27 detects the light emitted by the optical transmitter and produces at its output terminal a signal having a magnitude proportional to the real time magnitude of the signal at the output terminal of the magnitude measurement circuit, and hence proportional to the magnitude of the line voltage being measured. The signal produced by the magnitude optical receiver 27 is electrically isolated from the line voltage which is being monitored, the power supply (not shown) which supplies power to the magnitude measurement circuit, and the magnitude optical transmitter.

Electrically connected to the magnitude measurement circuit is a polarity detector 29 having an input terminal at which there is received an electrical signal proportional to the absolute value of the amplitude of the line voltage. The latter signal is compared with a reference voltage in order to detect a discontinuity which is indicative of a change in polarity of the line voltage.

A polarity optical transmitter 37 is illuminated to indicate a change in polarity of the source voltage. A polarity optical receiver detects the light emitted by the polarity optical transmitter and produces at its output terminal a signal having a magnitude indicative of the polarity change in the line voltage. Like the signal produced by the magnitude optical receiver 27, the signal produced by the polarity optical receiver 39 is electrically isolated from the line voltage.

Figure 3:
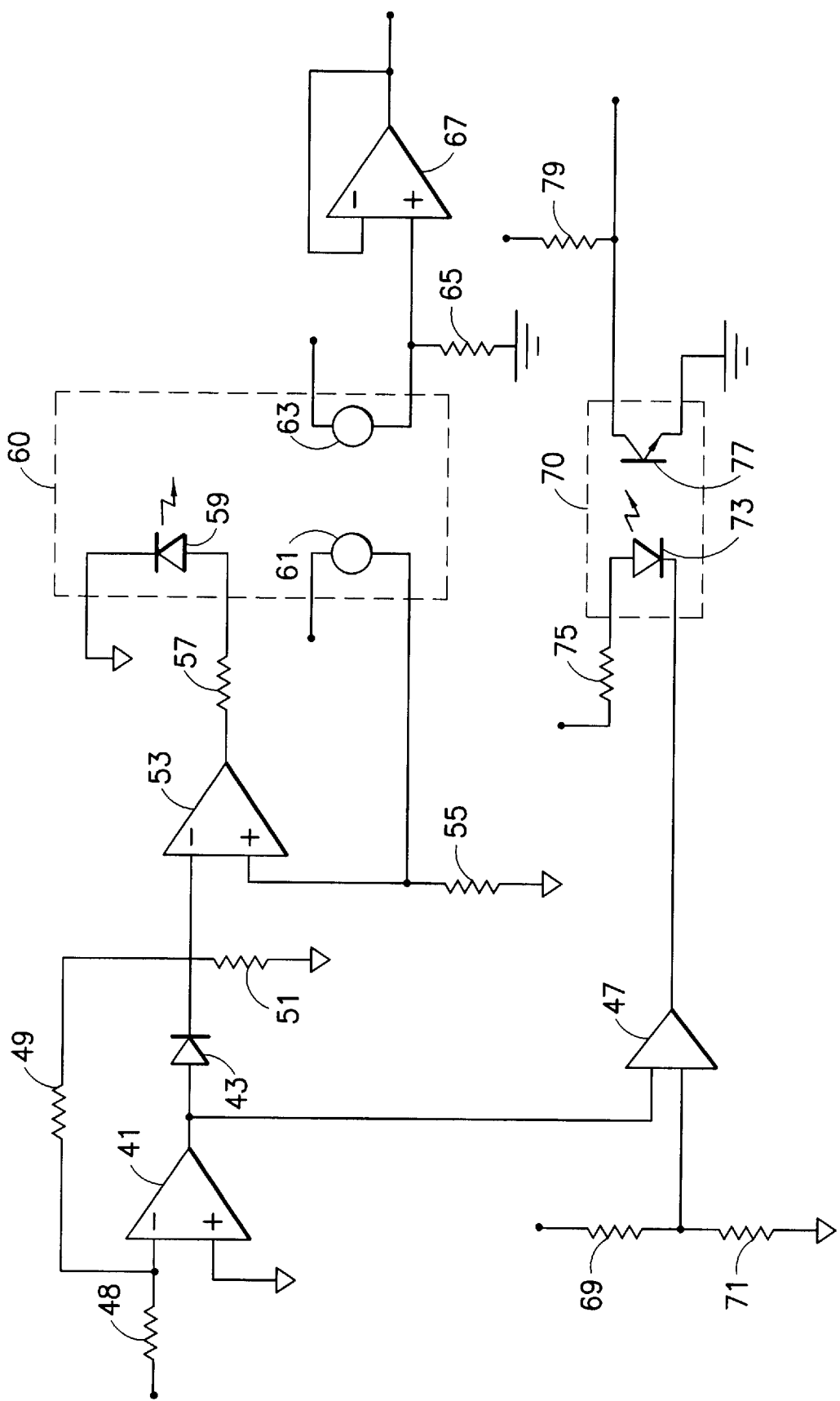
FIG. 3 is a schematic circuit diagram of the isolated line voltage sensing circuit of FIG. 2.

Referring now to FIG. 3 of the drawings, there is shown an electrical schematic diagram of the voltage sensing circuit 17 of FIG. 2. The line voltage at each phase of the three-phase power source 5 is applied to the negative input of an absolute value operational amplifier 41. The positive input of the operational amplifier 41 is connected to common.

The output signal from the absolute value operational amplifier 41, which has a magnitude proportional to and representative of the absolute value of the amplitude of the source phase voltage is applied to the anode of a diode 43 and to the input of a detector in the form of a comparator circuit 47. A feedback loop with a resistor 49 is provided between the output of the diode 43 and the negative input of the absolute value operational amplifier 41 to which the phase voltage is applied through a resistor 48.

The cathode of the diode 43 is connected to common through a resistor 51 and to the positive input of a D.C. amplifier 53 which has its negative input terminal connected to common through a resistor 55. The output terminal of the amplifier 53 is connected, through a resistor 57, to the anode of a light-emitting diode (LED) 59 in a linear optocoupler 60. The cathode of the LED 59 is connected to common.

A photosensor 61 in the optocoupler 60 is connected between a terminal to which a D.C. bias voltage is applied and the negative input of amplifier 53. The photosensor 61 is directed to receive the light transmitted from the LED 59. The LED 59 and photosensor 61 form an optically coupled negative feedback loop for the amplifier 53 so that the voltage produced across the photosensor 61 in response to the light emitted by the LED 59 is maintained at the same voltage as the output voltage of the absolute value operational amplifier 41.

A second photosensor 63 in the optocoupler 60 is also directed to receive the light transmitted from the LED 59. The photosensor 63 is connected to a grounded resistor 65 and a D.C. source of bias voltage. Hence the voltage across the photosensor 63 varies with the voltage across the photosensor 61 in accordance with the light output of LED 59. A D.C. amplifier 67 has a positive terminal connected to the photosensor 63 and resistor 5, and a negative terminal which receives, by feedback, the output signal of the amplifier 67.

Accordingly, the magnitude optical receiver circuit 27 formed by the photosensor 63, resistor 65, and amplifier 67 is optically coupled to, and electrically isolated from, the magnitude measurement circuit 19 and magnitude transmitter 25 (FIG. 2).

The bias voltage applied to the photosensor 61 is also applied, through a resistor 69 to one input of a comparator 47. The other input of comparator 47 is connected to receive the output of the absolute value operational amplifier 41. The output signal from the comparator 47 is applied to the cathode of a transmitter LED 73 in a sign optocoupler 70. The bias voltage applied to photosensor 61 is also applied, through a resistor 75, to the anode of the LED 73.

Positioned to be illuminated by the light of the LED 73 within the sign optocoupler 70 is a receiver phototransistor 77 having a grounded emitter. The collector of the phototransistor 77 is connected to the bias voltage applied to photosensor 63 through a resistor 79. A change in the polarity of the source line voltage is indicated by the signal produced at the collector of the phototransistor.

In use, the phase voltage being monitored is applied to the absolute value operational amplifier 41. When the voltage is positive with respect to common, the diode 43 cannot conduct. The operational amplifier 41 cannot maintain virtual ground at its output because the diode 43 prevents current flow from the output of the amplifier 41 to common. Hence the input current flows through resistors 48, 49, and 51 which act as a voltage divider in accordance with the following relationships.

$$V_{out} = IR_3$$

$$I = V_{in}/R_1+R_2+R_3$$

Therefore, $$V_{out} = V_{in}R_3/R_1+R_2+R_3, \text{ for } V_{in}>0$$

where $V_{out}$=the output voltage of operational amplifier 41, $V_{in}$=the phase voltage applied to the negative input of operational amplifier 41 through resistor 48, I is the input current flowing in resistor 48, $R_1$=the resistance of resistor 48, $R_2$=the resistance of resistor 49, and $R_3$=the resistance of resistor 51.

When the waveform of the phase voltage crosses from positive to negative, the voltage at the output of the operational amplifier 41 begins to increase and, when it reaches approximately 0.7 volts, diode 43 begins to conduct. The output current from the operational amplifier 41 now flows through diode 43, resistor 49, and resistor 48 to the phase line being monitored, and through resistor 51 to common.

The operational amplifier 41 maintains its negative input at virtual ground by varying its output voltage, $V_{out}$ as the input voltage, $V_{in}$, changes. Because the current in resistors 48 and 49 is the same, $$V_{out}/R_2 = V_{in}/R_1,$$

therefore, $$V_{out} = V_{in} R_2/R_1, \text{ for } V_{in} < 0.$$

Hence, the amplitude of the voltage $V_{out}$ is directly proportional to the phase voltage $V_{in}$ when the phase voltage is positive and when it is negative.

Even though the proportionality constant can be different for the positive and negative excursions of the phase voltage envelope, the magnitude of the phase input voltage $V_{in}$ can readily be determined from, $$V_{in} = V_{out}(R_1 + R_2 + R_3)/R_3 \text{ for } V_{in} > 0$$

$$V_{in} = V_{out} R_1/R_2, \text{ for } V_{in} < 0.$$

The output voltage $V_{out}$ is applied to the positive input of the absolute value operational amplifier 53 which drives the optocoupler LED 59. The absolute value operational amplifier 41 works to maintain the voltage produced by photosensor 61 at the same voltage as the output of the absolute value amplifier 41, $V_{out}$, by adjusting the voltage driving LED 59. The magnitude optical receiver formed by photosensor 63 and amplifier 67 sees the same incident light as photosensor 61, and produces the same or a proportional voltage at its output. This voltage is applied via an analog to digital (A/D) converter (not shown) to the controller 15 which is programmed to compute the phase voltage amplitude in accordance with the aforestated relationships.

Galvanic isolation is maintained because light, not electricity, is used to produce the output voltage of the amplifier 67. There is no electrical connection between the magnitude optical transmitter 25 and the magnitude optical receiver 27. The LED 59 and photosensor 63 provide a galvanically isolated signal having a waveform with an amplitude which is a reproduction of the amplitude waveform of the output voltage of the absolute value circuit 41.

The output of the absolute value operational amplifier 41 is continuously monitored. When the line voltage crosses from positive to negative, the absolute value operational amplifier 41 begins to supply current to the diode 43. The output of the absolute value operational amplifier 41 must quickly jump from 0 volts to 0.7 volts in order to turn on the diode 43 at its output. This jump in voltage is detected by the comparator 47 which drives the LED 73 of the sign polarity optical transmitter 37. The output of the polarity optical receiver 39 signals the controller 15 that the phase voltage has changed polarity. The controller can then apply the appropriate constants, consistent with the values of the resistors 48, 49, and 51, to derive the magnitude of the voltage at the respective monitored phase line. The microprocessor and supporting memory in the controller can be programmed to keep track of polarity changes in the A.C. source voltage for determining the polarity at any time as will be known to those skilled in the art.

The above described invention avoids the need for transformers, minimizes the size and weight of the control circuit, and can be automatically placed on a circuit board using surface mount components.

The values or identifiers for the components of the circuit of FIG. 3 are set forth in Table 1, below.

TABLE 1

| | |
|---|---|
| Resistor 48 | 1 Meg. |
| Resistor 49 | 3.09 K |
| Resistor 51 | 3.09 K |
| Resistor 55 | 200 K |
| Resistor 65 | 200 K |
| Resistor 69 | 10 K |
| Resistor 71 | 221 |
| Resistor 79 | 10 K |
| Operational Amplifier 41 | National Semiconductor LM2904 |
| Operational Amplifier 53 | National Semiconductor LM2904 |
| Comparator 47 | National Semiconductor LM2904 |
| Optocoupler 60 | COPY OF Claire LOC 110 |
| Optocoupler 70 | PS2501-2 |
| Diode 43 | 1N4148 |
| Amplifier 67 | National Semiconductor LM2904 |

It is to be appreciated that the foregoing is a description of a preferred embodiment of the invention to which variations and modifications may be made without departing from the spirit and scope of the invention.

What is claimed is:

1. Apparatus for indicating the magnitude of the voltage of an A.C. voltage source in real time comprising absolute value means including operational circuit means having an input electrically connectable to said source and an output, rectifier means having an input operatively connected to said operational circuit means output and a rectifier output, and voltage divider means operatively connected to said operational circuit means input and said rectifier means output for producing at said rectifier output a signal having an amplitude proportional to the absolute value of said voltage irrespective of the polarity of the voltage of said source, said absolute value means having no transformer, driver means, having an input electrically connected to said absolute value means and an output at which there is produced a signal having a magnitude proportional to the absolute value of said A.C. voltage, first light emitting means having an input operatively connected to said driver means output and a light output at which there is produced light having an intensity proportional to the absolute value of said A.C. voltage, and first light sensing means responsive to the light emitted at the light output of said first light emitting means for producing an electrical signal having a magnitude proportional to the absolute value of said voltage, said first light sensing means being optically coupled to and electrically isolated from said source.

2. Apparatus according to claim 1 further comprising feedback light sensing means electrically connected to the input of said absolute value means and optically coupled to the light output of said first light emitting means for causing the intensity of the light emitted by said first light emitting means to be proportional to the absolute value of the magnitude of said A.C. voltage.

3. Apparatus for indicating the magnitude and polarity of the voltage of an A.C. voltage source in real time comprising absolute value means having an input electrically connectable to said source for producing a signal having an amplitude proportional to the absolute value of said voltage, first light emitting means having an input electrically connected to said absolute value means and an output at which there is produced light having an intensity proportional to the absolute value of said voltage, first light sensing means responsive to the light emitted at the output of said first light emitting means for producing an electrical signal having a magnitude proportional to the absolute value of said voltage, said first light sensing means being electrically isolated from said source.

discontinuity means electrically connected to the output of said absolute value means for causing a discontinuity in the magnitude of the voltage at the output of said absolute value means in response to a change in polarity of said A.C. signal, detector means electrically connected to the output of said absolute value means for detecting said discontinuity, second light emitting means having an input electrically connected to said detector means and an optical output at which there is generated light having an intensity responsive to the change in polarity of said A.C. voltage, and second light sensing means responsive to the light emitted at the output of said second light emitting means for producing an electrical signal indicative of a change in the polarity of said A.C. voltage, said second light sensing means being electrically isolated from said source.

4. Apparatus according to claim 3 wherein said detector means comprises a comparator having an input electrically connected to the output of said absolute value means.

5. Apparatus according to claim 3 further comprising feedback light sensing means electrically connected to the input of said absolute value means and optically coupled to the output of said first light emitting means for causing the intensity of the light emitted by said first light emitting means to be proportional to the absolute value of the magnitude of said A.C. voltage.

6. Apparatus for indicating the polarity of the voltage of an A.C. voltage source in real time comprising absolute value means having an input electrically connectable to said source for producing a signal having an amplitude proportional to the absolute value of said voltage, discontinuity means electrically connected to the output of said absolute value means for causing a discontinuity in the magnitude of the voltage at the output of said absolute value means in response to a change in polarity of said A.C. signal, detector means electrically connected to the output of said absolute value means for detecting said discontinuity, polarity light emitting means having an input electrically connected to said detector means and an optical output at which there is generated light having an intensity responsive to the polarity of said A.C. voltage, and second light sensing means responsive to the light emitted at the output of said second light emitting means for producing an electrical signal having a magnitude indicative of the polarity of said A.C. voltage, said second light sensing means being electrically isolated from said source.

7. Apparatus according to claim 6 wherein said detector means comprises a comparator having an input electrically connected to the output of said absolute value means.

8. Apparatus according to claim 6 wherein said discontinuity means comprises a diode.

* * * * *